US011557544B2

(12) United States Patent
Vincent et al.

(10) Patent No.: US 11,557,544 B2
(45) Date of Patent: Jan. 17, 2023

(54) SEMICONDUCTOR DEVICE HAVING A TRANSLATION FEATURE AND METHOD THEREFOR

(71) Applicant: NXP USA, INC., Austin, TX (US)

(72) Inventors: Michael B. Vincent, Chandler, AZ (US); Giorgio Carluccio, Eindhoven (NL); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 153 days.

(21) Appl. No.: 17/004,425

(22) Filed: Aug. 27, 2020

(65) Prior Publication Data

US 2022/0068828 A1 Mar. 3, 2022

(51) Int. Cl.

*H01L 23/544* (2006.01)
*H01Q 1/22* (2006.01)
*H01Q 21/06* (2006.01)
*H01L 23/498* (2006.01)
*H01Q 1/32* (2006.01)
*H01Q 15/14* (2006.01)
*H01L 23/31* (2006.01)

(52) U.S. Cl.

CPC ......... *H01L 23/544* (2013.01); *H01Q 1/2283* (2013.01); *H01Q 21/064* (2013.01); *H01L 23/3107* (2013.01); *H01L 23/49816* (2013.01); *H01L 2223/54426* (2013.01); *H01Q 1/3233* (2013.01); *H01Q 15/14* (2013.01)

(58) Field of Classification Search

CPC ......... H01L 23/544; H01L 2223/54426; H01L 23/3107; H01L 23/49816; H01Q 1/2283; H01Q 13/06; H01Q 21/0087; H01Q 21/064

See application file for complete search history.

(56) References Cited

U.S. PATENT DOCUMENTS 3,603,904 A * 9/1971 Hafner ...................... H01P 3/10 333/240
6,356,173 B1 * 3/2002 Nagata .................... H01L 23/66 333/260
9,257,735 B2 2/2016 Fakharzadeh et al.
9,300,025 B2 * 3/2016 Herbsommer ....... H01Q 1/2283
9,520,635 B2 12/2016 Fakharzadeh et al.
9,583,811 B2 * 2/2017 Seler ..................... H01P 11/003
10,103,447 B2 * 10/2018 Tong ................... H01L 31/0203
10,164,318 B2 * 12/2018 Seok ......................... H05K 3/20
11,133,273 B2 * 9/2021 Vincent ............... H01L 21/4857
11,152,707 B1 * 10/2021 Janett .................... H01L 23/057
2005/0088260 A1 * 4/2005 Ajioka .................... H01L 23/66 257/E23.114
2012/0050125 A1 * 3/2012 Leiba .................. H01Q 1/2283 343/834

(Continued)

*Primary Examiner* — Bilkis Jahan
*Assistant Examiner* — Victor V Barzykin

(57) ABSTRACT

A semiconductor device is provided. The device includes a semiconductor die and a launcher structure attached to a package substrate. The launcher structure includes a launcher substrate, a launcher portion formed from a conductive layer at a major surface of the launcher substrate, and a translation pad formed from the conductive layer at the major surface. The translation pad is separate from the launcher portion. A translation feature is formed on the translation pad. The translation feature is configured for alignment of a waveguide structure.

20 Claims, 9 Drawing Sheets

210
212
200
202
206
208
214
216
134
116
138
118
136
100
110
102
110
104
144
204

(56) References Cited

U.S. PATENT DOCUMENTS

2013/0154091 A1 6/2013 Wright et al.
2014/0285389 A1* 9/2014 Fakharzadeh .......... H01Q 13/02 343/786
2014/0285393 A1* 9/2014 Biglarbegian ........ H01P 11/001 333/260
2014/0287703 A1* 9/2014 Herbsommer ......... H01Q 19/30 333/21 R
2015/0171033 A1* 6/2015 Seler ..................... H01L 21/565 257/664
2016/0043455 A1* 2/2016 Seler ........................ H04B 5/00 29/601
2016/0164189 A1* 6/2016 Jafarlou ................. H01Q 13/02 29/601
2019/0089044 A1* 3/2019 Kobuke .............. H01L 21/4807
2019/0207287 A1* 7/2019 Dogiamis ............. H01P 5/1015
2020/0251430 A1* 8/2020 Seler .................... H01Q 25/007
2020/0294939 A1* 9/2020 Aleksov .................. H01L 24/16
2020/0343612 A1* 10/2020 Shi ........................... H01Q 9/16
2020/0403298 A1* 12/2020 Vincent ................... H01L 23/66
2021/0175637 A1* 6/2021 Kang ................... H01Q 21/065
2021/0183796 A1* 6/2021 Vincent .............. H01Q 21/0087
2021/0183797 A1* 6/2021 Vincent ............... H01L 23/5389
2021/0225719 A1* 7/2021 Seler ....................... H01L 24/20
2021/0359387 A1* 11/2021 Hartner .................. H01Q 1/525
2022/0029281 A1* 1/2022 Fischer ................ H05K 1/0243
2022/0059918 A1* 2/2022 Hartner .................. H05K 1/028
2022/0069430 A1* 3/2022 Cogoni .................... H01Q 1/12

* cited by examiner

SEMICONDUCTOR DEVICE HAVING A TRANSLATION FEATURE AND METHOD THEREFOR

BACKGROUND

Field

This disclosure relates generally to semiconductor device packaging, and more specifically, to a semiconductor device having a translation feature and method of forming the same.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can benefit from performance improvements while minimizing costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device including a packaged assembly having a translation feature.

A translation pad in the packaged assembly is formed from a same metal layer as a launcher. The translation feature is formed on the translation pad and is made visible at a surface of the packaged assembly. The visible portion of the translation feature provides a known relative location to the launcher and enables high accuracy alignment of a waveguide structure. The visible portion of the translation feature may be configured for indicating a thickness of an encapsulant and/or planarity of the packaged assembly.

Figure 1:
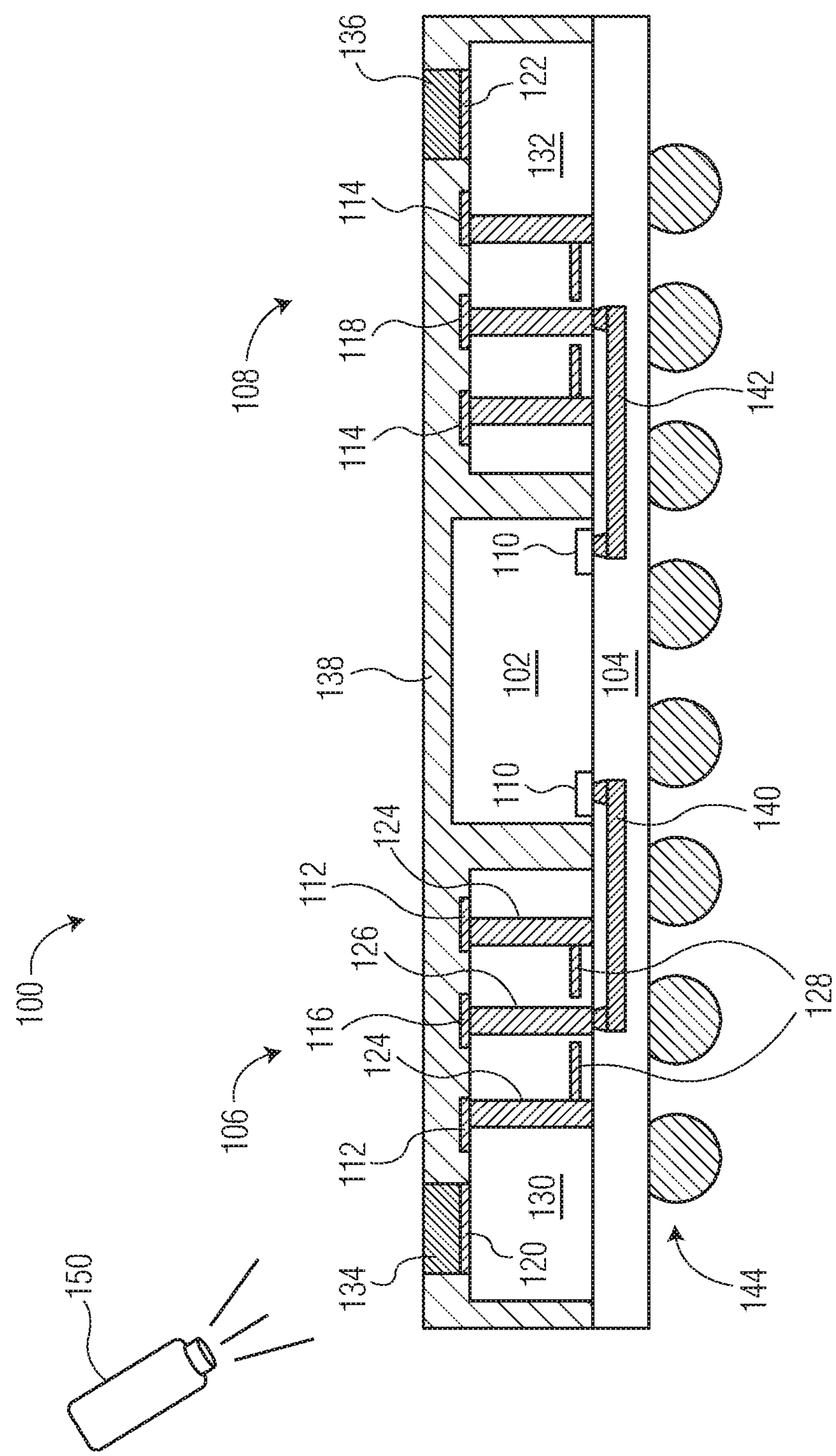
FIG. 1 illustrates, in a simplified cross-sectional view, an example semiconductor device packaged assembly in accordance with an embodiment.

FIG. 1 illustrates, in a simplified cross-sectional view, an example semiconductor device packaged assembly 100 in accordance with an embodiment. At this stage of manufacture, the assembly 100 includes a semiconductor die 102 and launcher structures 106 and 108 encapsulated on a package substrate 104.

The semiconductor die 102 has an active surface (e.g., major surface having circuitry) and a backside surface (e.g., major surface opposite of the active surface). The semiconductor die 102 includes bond pads 110 at the active surface configured for connection to launchers 116 and 118 by way of the package substrate 104, for example. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, signal processor, MEMS, sensors, the like, and combinations thereof.

The package substrate 104 has a top surface and a bottom surface. The package substrate 104 is configured and arranged to provide interconnect among the semiconductor die 102, the launcher structures 106 and 108, and a printed circuit board (PCB). For example, conductive feeds 140 and 142 formed in the package substrate 104 are used to interconnect bond pads 110 of the semiconductor die 102 with launchers 116 and 118 of the launcher structures 106 and 108 respectively. In this embodiment, conductive features of the package substrate 104 such as the conductive feeds 140 and 142 may be formed from a copper material or other suitable metal material. Conductive ball connectors 144 (e.g., solder balls) are affixed to the bottom surface of the package substrate 104. The ball connectors 144 are configured and arranged to provide conductive connections between the package substrate 104 and the PCB, for example. Ball connectors 144 may be any suitable conductive structure such as solder balls, gold studs, copper pillars, and the like, to connect conductive features of the semiconductor die 102 and the launcher structures 106 and 108 with the PCB. In one embodiment, the package substrate 104 may be formed as a build-up substrate including a redistribution layer. In one embodiment, the package substrate 104 may be formed as a pre-formed substrate including a redistribution layer. In the embodiment depicted in FIG. 1, the semiconductor die 102 and the launcher structures 106 and 108 are affixed to a same surface (e.g., top surface) of the package substrate 104. In one embodiment, the semiconductor die 102 may be affixed to an opposite surface (e.g., bottom surface) of the package substrate as that of the launcher structures 106 and 108 (e.g., affixed at top surface).

The launcher structures 106 and 108 are each formed as a multilayer laminate structure having conductive features (e.g., metal or other conductive materials) separated by non-conductive material (e.g., FR-4, ceramic). In this embodiment, the launcher structures 106 and 108 each include a launcher (116, 118), a surrounding ring (112, 114), and a translation pad (120, 122) formed from a same metal layer located at a top surface of a launcher substrate (130, 132). Because launcher structures 106 and 108 are formed similarly in this embodiment, launcher structure 106 will be described in further detail.

Launcher structure 106 includes conductive features such as interconnecting vias 124 and 126, signal reflector 128, launcher 116, surrounding ring 112, and translation pad 120 formed with launcher substrate 130. Vias 124 and vias 126 provide conductive connections between a bottom surface of the launcher structure 106 and respective surrounding ring 112 and launcher 116 formed at the top surface of the launcher structure 106. Vias 124 are configured and arranged to serve as a conductive wall or fence substantially surrounding the launcher 116. Vias 124 may be formed as a series of closely spaced conductive pillars or a continuous conductive structure, for example, to surround the launcher 116. In some embodiments, it may be desirable to connect the conductive wall or fence to a ground supply terminal or other supply terminal. In this embodiment, a patterned conductive layer of the launcher structure 106 is configured and arranged to serve as a signal reflector located below the launcher 116 and substantially surrounding the via 126 interconnecting the antenna launcher 116 with the substrate 104. In some embodiments, the signal reflector 128 may be located on a next conductive layer immediately below the antenna launcher 116. In this embodiment, the translation pad 120 is located separate from launcher 116 and outside of the wall or fence formed by vias 124. Because the translation pad is formed from a same metal layer as the launcher 116, the translation pad 120 provides an accurate location relative to the location of the launcher 116.

At this stage of manufacture, the assembly 100 further includes translation features 134 and 136 formed on respective translation pads 120 and 122. An encapsulant (e.g., epoxy material) 138 at least partially encapsulates semiconductor die 102 and launcher structures 106 and 108 affixed on the package substrate 104. At least a portion of the translation features 134 and 136 are exposed at a top surface of the encapsulant 138. In one embodiment, the semiconductor die 102 and launcher structures 106 and 108 are over-molded with an epoxy material encapsulant by way of a film-assisted molding (FAM) process to expose the translation features 134 and 136. In one embodiment, the semiconductor die 102, launcher structures 106 and 108, and translation features 134 and 136 are over-molded with an epoxy material encapsulant then subjected to a back-grind process to expose at least a portion of the translation features 134 and 136. In this embodiment, the exposed portions of the translation features 134 and 136 are characterized as high-contrast relative to the encapsulant and are configured for recognition by a vision system 150. For example, the exposed portions of the translation features 134 and 136 may have a very light (e.g., white) appearance to the vision system 150, whereas the encapsulant 138 may have a very dark (e.g., black) appearance to the vision system 150. Because the translation features 134 and 136 are formed directly on the respective translation pads 120 and 122, exposed portions of the translation features 134 and 136 provide accurate locations relative to the locations of respective launchers 116 and 118. Accordingly, by way of the translation features 134 and 136 in a subsequent operation, a waveguide structure can be accurately aligned to launchers 116 and 118 embedded in the encapsulant 138.

Figure 2:
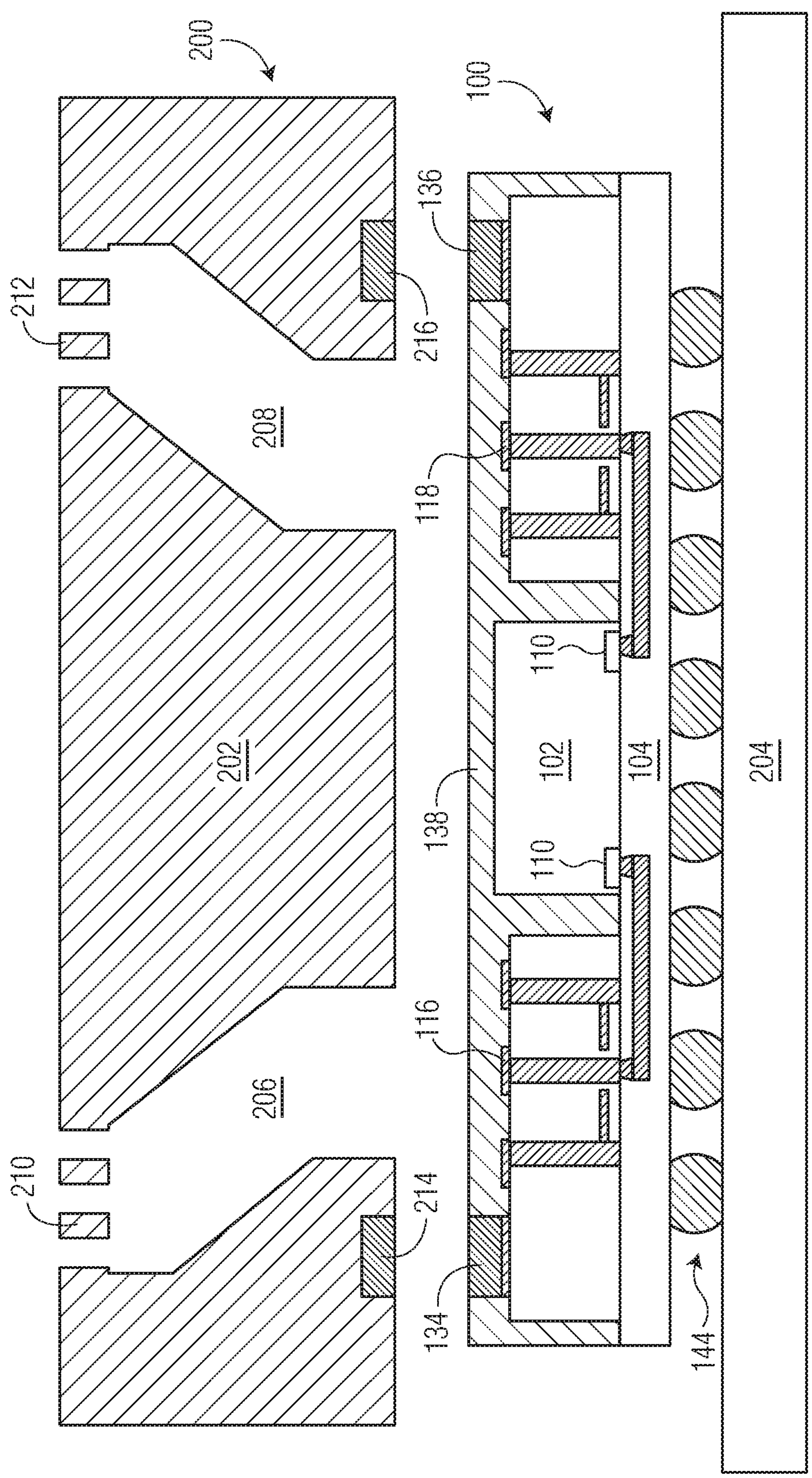
FIG. 2 illustrates, in a simplified cross-sectional view, the example semiconductor device packaged assembly with a waveguide structure in accordance with an embodiment.

FIG. 2 illustrates, in a simplified cross-sectional view, the example semiconductor device packaged assembly 100 with a waveguide structure 200 in accordance with an embodiment. In this embodiment, the waveguide structure 200 is affixed over the assembly 100 mounted on a PCB 204. The waveguide structure 200 includes waveguides 206 and 208 (e.g., waveguide openings) and waveguide antenna portions 210 and 212 formed in a waveguide body 202. Waveguide alignment features 214 and 216 are formed on a surface of the waveguide body 202 to facilitate alignment with the assembly 100.

The assembly 100 is affixed to the PCB 204 by way of the conductive ball connectors 144 affixed to the bottom surface of the package substrate 104. By way of the translation features 134 and 136 and the alignment features 214 and 216, a vision system (e.g., vision system 150 depicted FIG. 1) provides location data such that the waveguides 206 and 208 are accurately aligned with corresponding launchers 116 and 118. The aligned waveguide structure 200 is affixed over the encapsulant 138 of the assembly 100. In one embodiment, the aligned waveguide structure 200 may be configured for attachment to the PCB 204. In one embodiment, the aligned waveguide structure 200 may be configured for attachment to a top surface of the assembly 100.

Figure 3A:
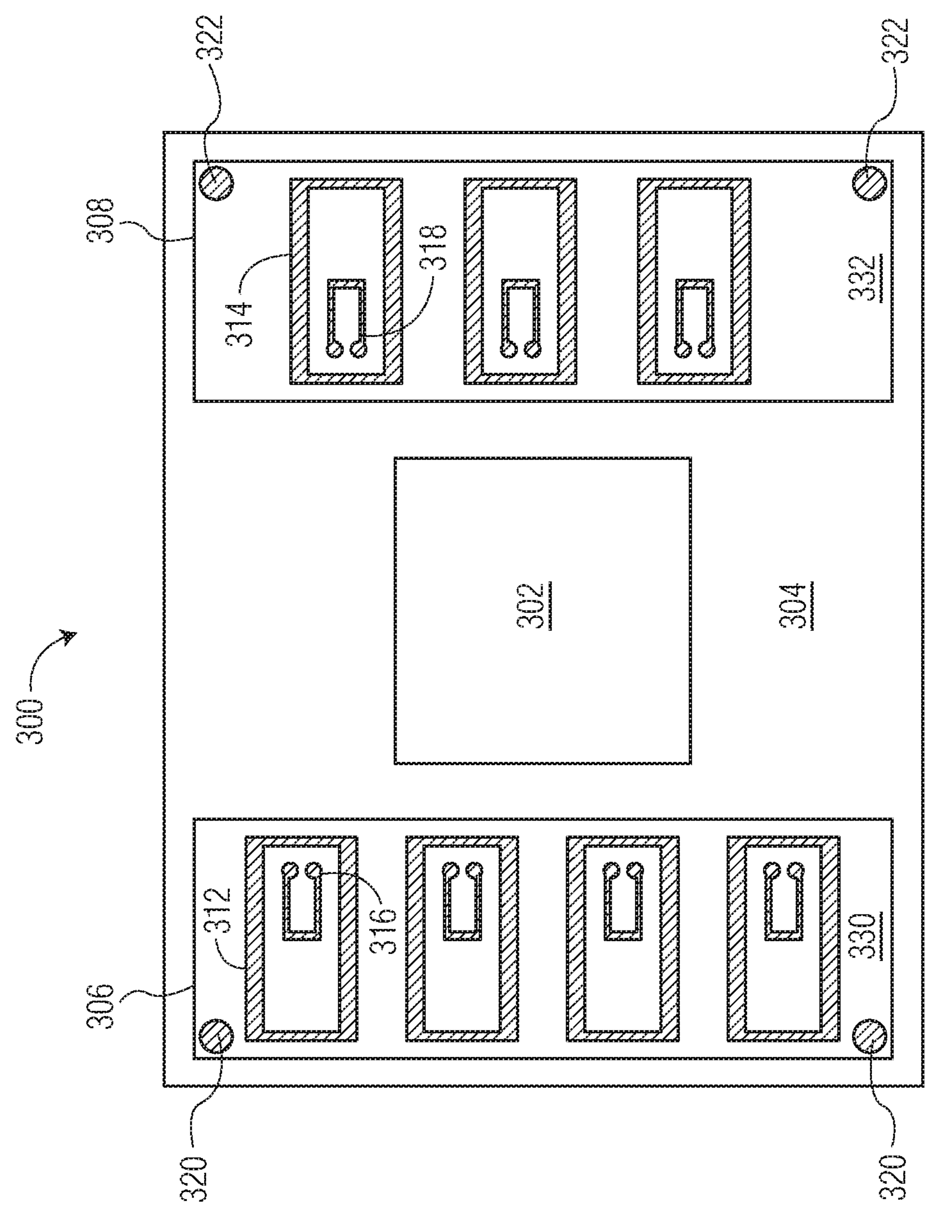
FIG. 3A illustrates, in a simplified plan view, an example semiconductor device assembly at a stage of manufacture in accordance with an embodiment.

FIG. 3A illustrates, in a simplified plan view, an example semiconductor device assembly 300 at a stage of manufacture in accordance with an embodiment. At this stage of manufacture, the assembly 300 includes a semiconductor die 302 and launcher structures 306 and 308 placed on a package substrate 304. In this embodiment, launcher structure 306 may be characterized as a receiver (RX) launcher structure having a set of four launchers 316 and corresponding surrounding rings 312 at a top surface of launcher substrate 330. Launcher structure 308 may be characterized as a transmitter (TX) launcher structure having a set of three launchers 318 and corresponding surrounding rings 314 at a top surface of launcher substrate 332. Translation pads 320 are located at the top surface of launcher substrate 330 and are formed from a same metal layer as launchers 316 and corresponding surrounding rings 312. Translation pads 322 are located at the top surface of launcher substrate 332 and are formed from a same metal layer as launchers 318 and corresponding surrounding rings 314.

Figure 3B:
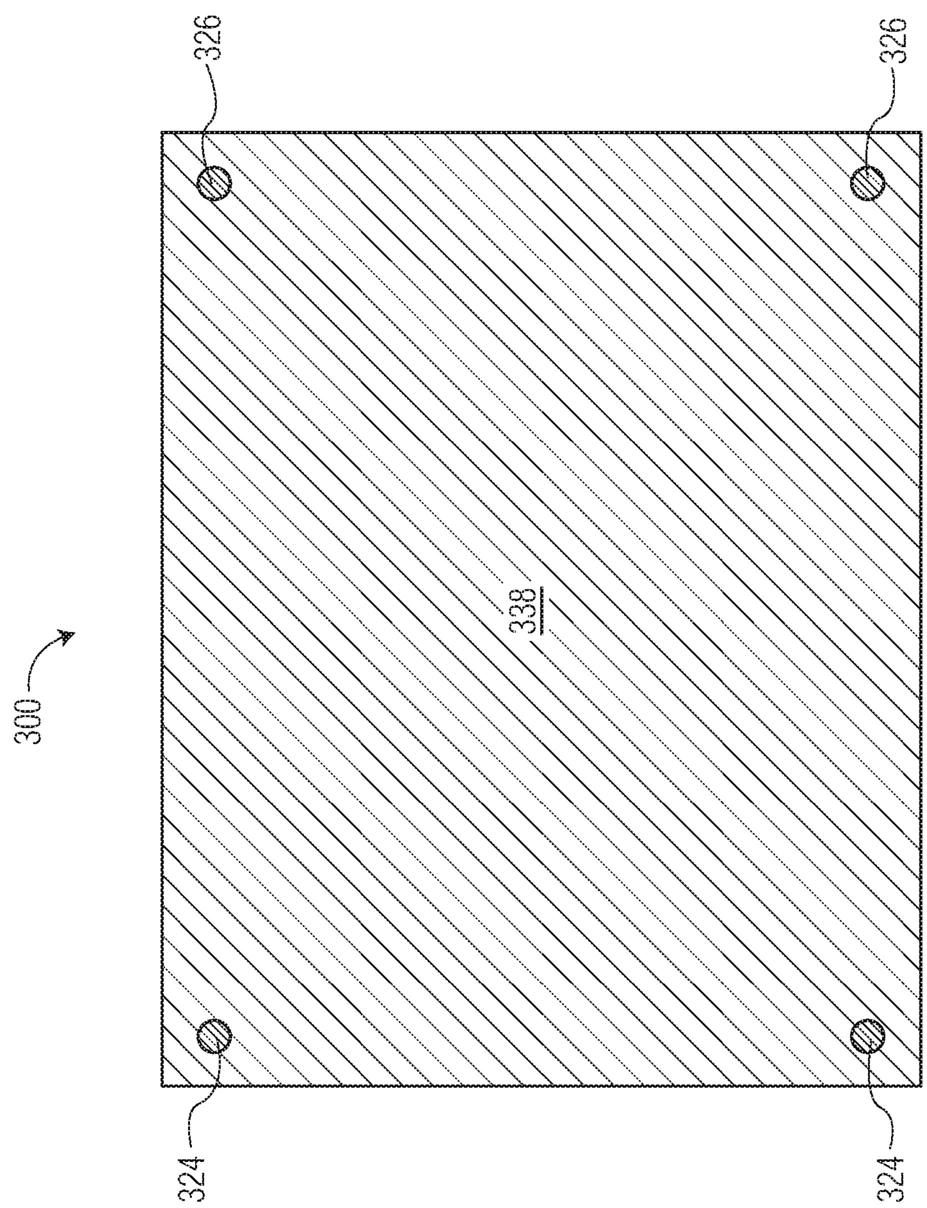
FIG. 3B illustrates, in a simplified plan view, the example semiconductor device assembly at a subsequent stage of manufacture in accordance with an embodiment.

FIG. 3B illustrates, in a simplified plan view, the example semiconductor device assembly 300 at a subsequent stage of manufacture in accordance with an embodiment. At this stage of manufacture, the assembly 300 further includes translation features 324 and 326 formed on respective translation pads 320 and 322. An encapsulant (e.g., epoxy material) 338 encapsulates semiconductor die 302 and launcher structures 306 and 308. At least a portion of the translation features 324 and 326 are exposed at a top surface of the encapsulant 338. In one embodiment, the semiconductor die 302 and launcher structures 306 and 308 are over-molded with an epoxy material encapsulant by way of a film-assisted molding (FAM) process to expose the translation features 324 and 326. In one embodiment, the semiconductor die 302, launcher structures 306 and 308, and translation features 324 and 326 are over-molded with an epoxy material encapsulant then subjected to a back-grind process to expose at least a portion of the translation features 324 and 326. In this embodiment, the exposed portions of the translation features 324 and 326 are characterized as high-contrast relative to the encapsulant and are configured for recognition by to a vision system 150.

Figure 4:
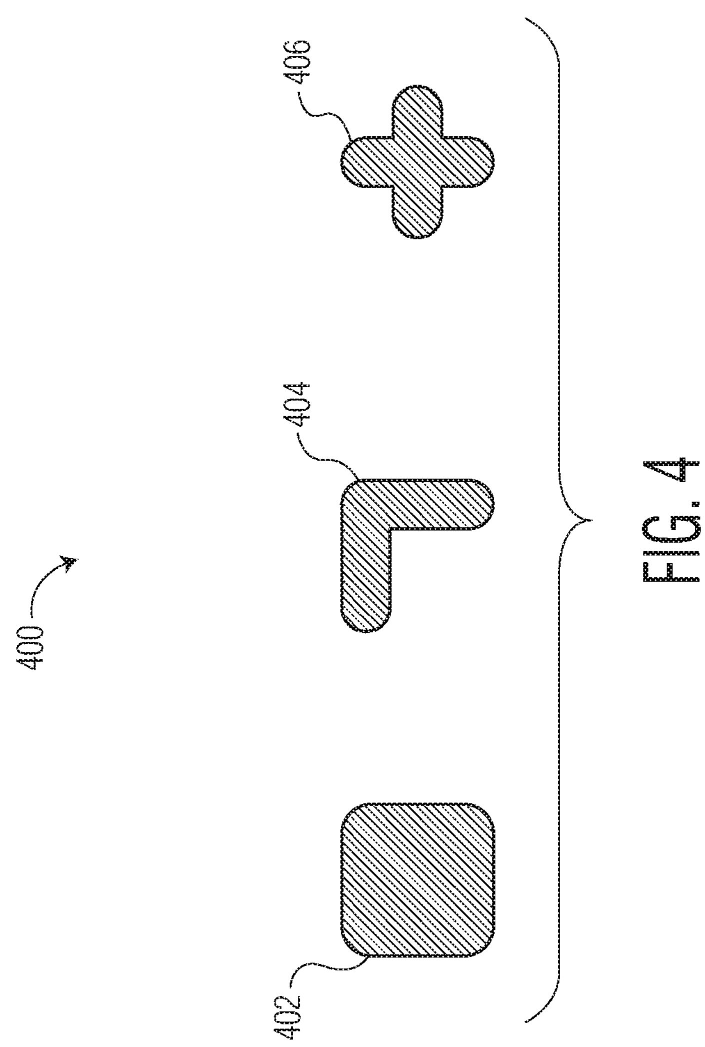
FIG. 4 illustrates, in a simplified plan view, example translation feature shapes in accordance with an embodiment.

FIG. 4 illustrates, in a simplified plan view, example translation feature shapes 400 in accordance with an embodiment. In some embodiments, translation features (e.g., translation features 324 and 326 of semiconductor device assembly 300 depicted in FIG. 3B) may be formed in alternative shapes such as a square shape 402, an "L" shape 404, and a "+" shape 406, for example. In other embodiments, the translation features may be formed in other suitable shapes to further accommodate recognition by a vision system, for example. These alternative shaped translation features, when exposed at a top surface of an encapsulant, are characterized as high-contrast relative to the encapsulant.

Figure 5:
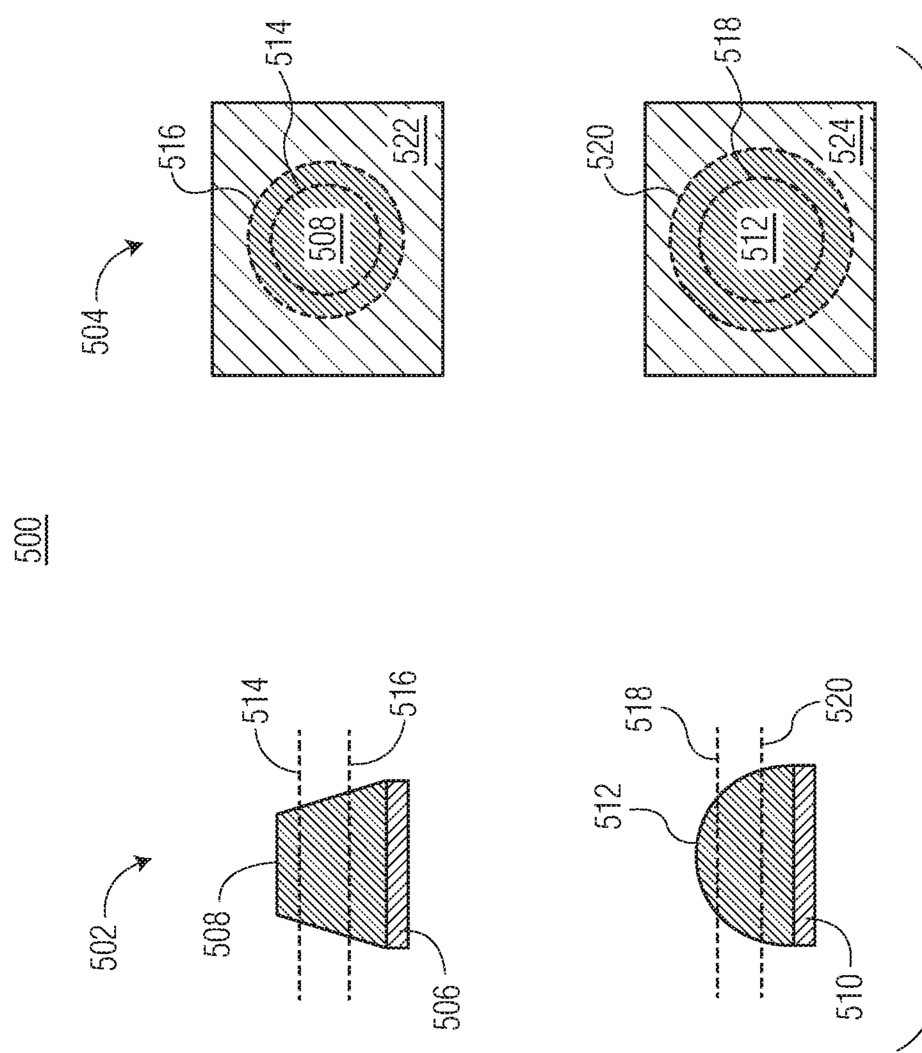
FIG. 5 illustrates, in simplified cross-sectional views and corresponding plan views, example translation features having a depth indication in accordance with an embodiment.

FIG. 5 illustrates, in simplified cross-sectional views and corresponding plan views, example translation features 500 having a depth indication in accordance with an embodiment. In some embodiments, translation features (e.g., translation features 324 and 326 of FIG. 3B) may be further configured to provide an indication of depth (e.g., an amount of encapsulant material removed). The depth indication may also be referred to as an indication of height (e.g., a thickness of encapsulant material remaining). Cross-sectional views 502 illustrate a conical shaped translation feature 508 and a domed shape translation feature 512 configured to provide an indication of depth. Corresponding plan views 504 of the conical shaped translation feature 508 and the domed shape translation feature 512 include concentric dashed rings corresponding to example diameters of exposed translation features.

In this embodiment, the conical translation feature 508 is formed on a translation pad 506. Example depth indicators are depicted by a first dashed line 514 and a second dashed line 516 in the cross-sectional view 502 and corresponding first dashed circle 514 and second dashed circle 516 in the plan view 504. For example, when forming a packaged semiconductor device assembly (e.g., assembly 300 in FIG. 3B) translation feature 508 is over-molded with an encapsulant 522 then subjected to a back-grind operation to expose a top portion of the translation features 508. As more encapsulant material (and translation feature material) is removed by way of the back-grind operation, the diameter of the exposed portion of the translation feature 508 increases. In one embodiment, it may be desirable to back-grind until at least a diameter of the exposed translation feature is equal to the diameter of the first dashed circle 514. In some embodiments, it may be desirable to back-grind until a resulting diameter of the exposed translation feature is within a range between the first dashed circle 514 and the second dashed circle 516. In one embodiment, it may be desirable to compare multiple exposed translation feature diameters after back-grinding to determine planarity of a packaged semiconductor device assembly (e.g., assembly 300 in FIG. 3B). For example, if all translation features (e.g., 324, 326 of FIG. 3B) after a back-grind operation have substantially similar diameters, then it may be an indication that the assembly is substantially planar. However, if at least one of the translation features after a back-grind operation has a substantially different diameter from the other translation features, then it may be an indication that the assembly is not planar. For example, after the back-grid operation, if the exposed translation features 324 of FIG. 3B have diameters substantially similar to the first dashed circle 514 and the exposed translation features 326 of FIG. 3B have diameters substantially similar to the second dashed circle 516, then it may be determined that the assembly is not planar.

The domed translation feature 512 is formed on a translation pad 510 in this embodiment. Example depth indicators are depicted by a first dashed line 518 and a second dashed line 520 in the cross-sectional view 502 and corresponding first dashed circle 514 and second dashed circle 516 in the plan view 504. For example, when forming a packaged semiconductor device assembly (e.g., assembly 300 in FIG. 3B) translation feature 512 is over-molded with an encapsulant 524 then subjected to a back-grind operation to expose a top portion of the translation features 512. As more encapsulant material (and translation feature material) is removed by way of the back-grind operation, the diameter of the exposed portion of the translation feature 512 increases. In one embodiment, it may be desirable to back-grind until at least a diameter of the exposed translation feature is equal to the diameter of the first dashed circle 518. In some embodiments, it may be desirable to back-grind until a resulting diameter of the exposed translation feature is within a range between the first dashed circle 518 and the second dashed circle 520. In one embodiment, it may be desirable to compare multiple exposed translation feature diameters after back-grinding to determine planarity of a packaged semiconductor device assembly (e.g., assembly 300 in FIG. 3B). For example, if all translation features (e.g., 324, 326 of FIG. 3B) after a back-grind operation have substantially similar diameters, then it may be an indication that the assembly is substantially planar. However, if at least one of the translation features after a back-grind operation has a substantially different diameter from the other translation features, then it may be an indication that the assembly is not planar.

Figure 6:
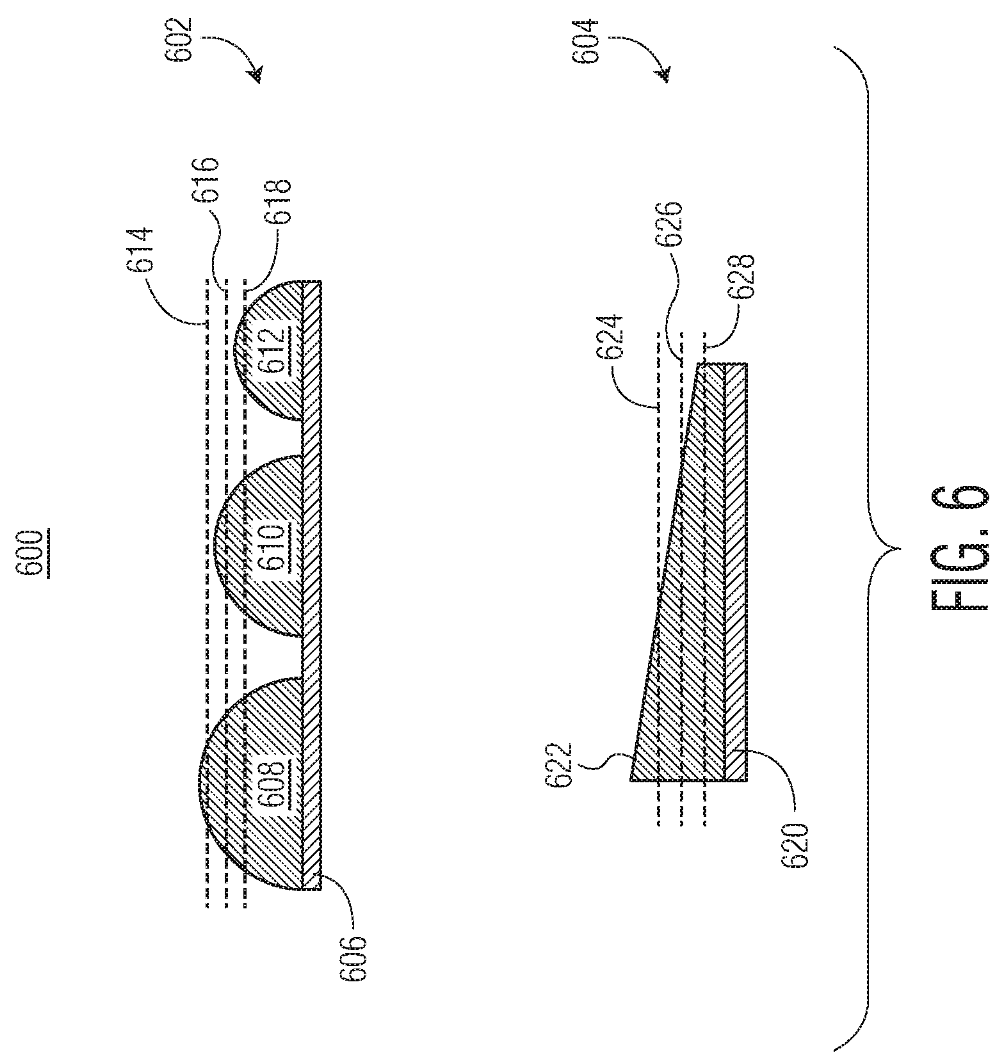
FIG. 6 illustrates, in simplified cross-sectional views, alternative example translation features configured for depth indication in accordance with an embodiment.

FIG. 6 illustrates, in simplified cross-sectional views, alternative example translation features 600 configured for depth indication in accordance with an embodiment. In this embodiment, a set of domed translation features structure 602 and a ramped translation feature structure 604 are depicted. The domed set structure 602 and the ramped structure 604 are each configured to provide an indication of depth (e.g., an amount of encapsulant material removed). The depth indication may also be referred to as an indication of height (e.g., a thickness of encapsulant material remaining).

In this embodiment, the domed set translation feature 602 includes a series of dome shaped translation features 608, 610, and 612 having differing heights. The dome shaped translation features 608-612 are formed on a translation pad 606. Example depth indicators are depicted by a set of dashed lines 614, 616, and 618. For example, when forming a packaged semiconductor device assembly (e.g., assembly 300 in FIG. 3B) the domed set translation feature 602 is over-molded with an encapsulant then subjected to a back-grind operation to expose a portion (e.g., dome translation feature 608) of the domed set translation feature 602. As more encapsulant material (and translation feature material) is removed by way of the back-grind operation, additional portions of the domed set translation feature 602 (e.g., dome translation features 610 and 612) may be exposed. In one embodiment, it may be desirable to back-grind until at least a diameter of the exposed translation feature 608 corresponds to the first depth indicator dashed line 614. In one embodiment, it may be desirable to compare exposed portions of multiple domed set translation features 602 after back-grinding to determine planarity of a packaged semiconductor device assembly (e.g., assembly 300 in FIG. 3B). For example, if all domed set translation features 602 (e.g., 324, 326 of FIG. 3B) after a back-grind operation have substantially similar exposed portions (e.g., each of domed translation features 608 and 610 exposed to depth indicator 616), then it may be an indication that the assembly is substantially planar. However, if at least one of the domed set translation features 602 after a back-grind operation has a substantially different amount of the domed set translation feature 602 exposed compared with the other domed set translation features 602, then it may be an indication that the assembly is not planar.

The ramped translation feature 604 includes a ramp or wedge shaped translation feature 622 formed on a translation pad 620. Example depth indicators are depicted by a set of dashed lines 624, 626, and 628. For example, when forming a packaged semiconductor device assembly (e.g., assembly 300 in FIG. 3B) the translation feature 622 is over-molded with an encapsulant then subjected to a back-grind operation to expose a portion of the translation feature 622. As more encapsulant material (and translation feature material) is removed by way of the back-grind operation, the amount of the exposed portion of the translation feature 620 increases. In one embodiment, it may be desirable to back-grind until at least an exposed portion of the translation feature 622 corresponds to the first depth indicator dashed line 624. In some embodiments, it may be desirable to back-grind until a resulting portion of the exposed translation feature 622 is within a range between the first depth indicator dashed line 624 and the third depth indicator dashed line 628. In one embodiment, it may be desirable to compare exposed portions of multiple translation features 622 after back-grinding to determine planarity of a packaged semiconductor device assembly (e.g., assembly 300 in FIG. 3B). For example, if of the translation features 622 (e.g., 324, 326 of FIG. 3B) after a back-grind operation have substantially similar exposed portions (e.g., amount of exposed area), then it may be an indication that the assembly is substantially planar. However, if at least one of the translation features 622 after a back-grind operation has a substantially different amount of exposed area compared with the other translation features 622, then it may be an indication that the assembly is not planar.

Figure 7:
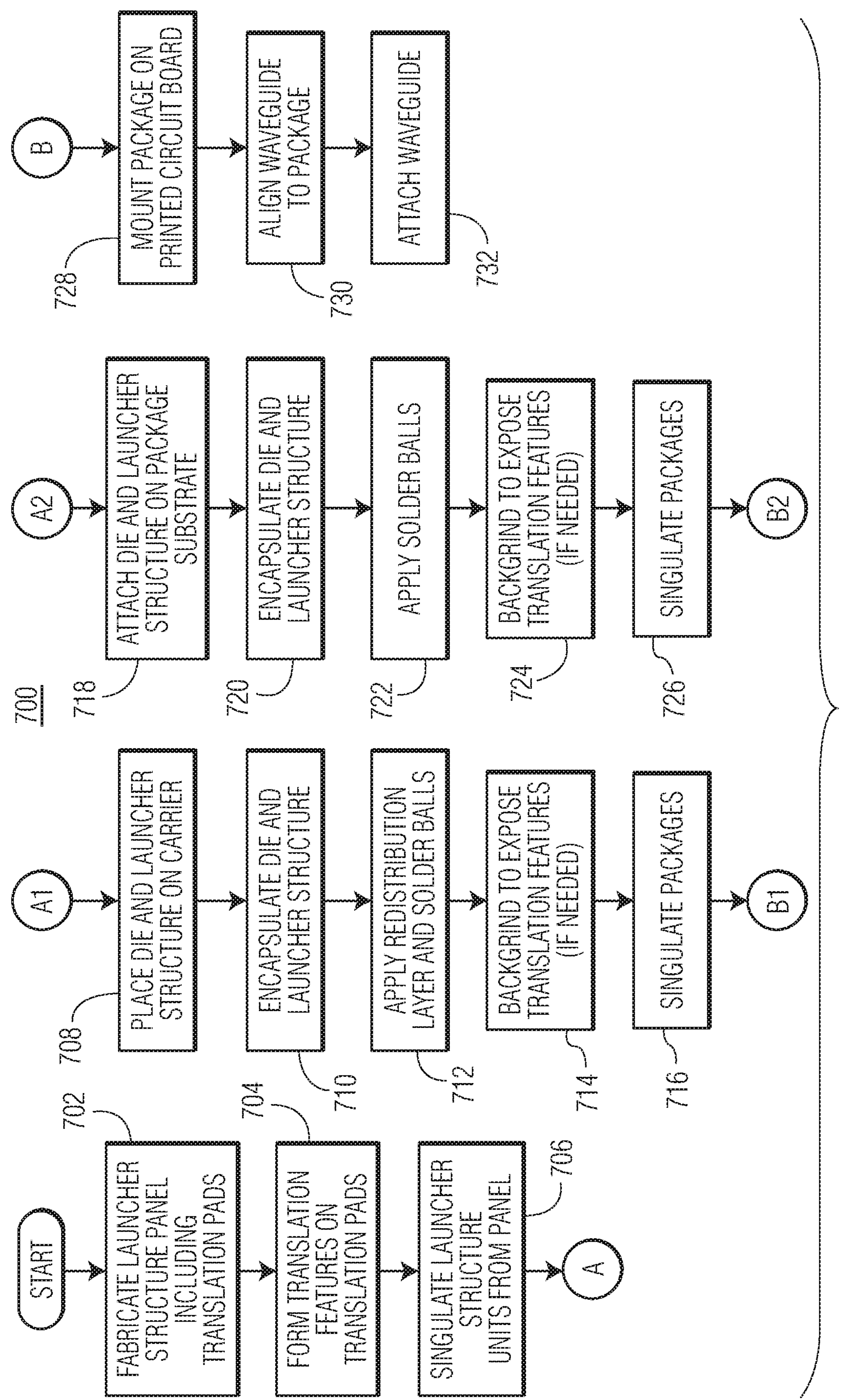
FIG. 7 illustrates, in a simplified flow diagram form, an example method of forming a semiconductor device assembly with waveguide structure in accordance with an embodiment.

FIG. 7 illustrates, in a simplified flow diagram form, an example method 700 of forming a semiconductor device assembly with waveguide structure in accordance with an embodiment. In this embodiment, steps 702-706 (START to flow connector A) of the method 700 include forming a launcher structure. Steps 708-716 (continuing at flow connector A1 to B1) include forming a packaged assembly and steps 718-726 (continuing at flow connector A2 to B2) include forming an alternative packaged assembly. Steps 728-732 (continuing at flow connector B) include mounting the packaged assembly to a PCB and attaching a waveguide structure.

At step 702, fabricate launcher substrate panel including translation pads. In this embodiment, a panel having a plurality of launcher structures (e.g., launcher structures 106 and 108 of FIG. 1) is formed. Each of the launcher structures in the panel is formed as a multilayer laminate structure having conductive features (e.g., metal or other conductive materials) separated by non-conductive material (e.g., FR-4, ceramic). The launcher structures include a launcher and a translation pad formed from a same metal layer located at a top surface of the launcher structure. The translation pad is located separate from launcher and provides an accurate location relative to the location of the launcher.

At step 704, form translation features on the translation pads. In this embodiment, translation features are formed on and in alignment with corresponding translation pads. The translation features may be formed from any suitable high contrast material such as adhesive material, dielectric material, solder paste, reflowed solder ball, and plating. The translation features may be formed in shapes suitable for recognition by a vision system such as a circle, square, "L" shape, "+" shape, for example. In some embodiments, the translation features may be formed having conical, dome, or wedge shapes, for example, configured for providing an indication of depth (or thickness of an encapsulant).

At step 706, singulate launcher structure units from panel. In this embodiment, each launcher structure unit of the plurality of launcher structures formed in the panel is singulated. The resulting individual launcher structures are provided to form an assembly in subsequent steps of sub-flows A1-B1 and A2-B2. In some embodiments, the launcher structures formed in a panel may be characterized as a plurality of receiver (RX) launcher structures, a plurality of transmitter (TX) launcher structure, or a combination of RX and TX launcher structures.

The A1-B1 flow continues from flow connector A after step 706. At step 708, place die and launcher structure on a carrier. In this embodiment, a semiconductor die and a launcher structure (e.g., from step 706) are placed on a carrier substrate.

At step 710, encapsulate die and launcher structure. In this embodiment, an encapsulant (e.g., epoxy material) at least partially encapsulates the semiconductor die and launcher structure placed on the carrier substrate. In one embodiment, the semiconductor die and launcher structure are over-molded with an epoxy material encapsulant by way of a film-assisted molding (FAM) process configured to expose the translation features at a top surface of the encapsulant. In one embodiment, the semiconductor die and launcher structure are over-molded with an epoxy material encapsulant, then subjected to a back-grind process in a subsequent step to expose at least a portion of the translation feature.

At step 712, apply redistribution layer (RDL) and solder balls. In this embodiment, the carrier substrate is removed exposing a bottom surface of the launcher structure and an active surface of the semiconductor die. The RDL substrate is applied to the resulting exposed surfaces the semiconductor die and the launcher structure. Conductive feeds are formed in the RDL substrate to interconnect the semiconductor die and the launcher structure. After the RDL substrate is applied, conductive ball connectors (e.g., solder balls) are affixed to a bottom surface of the RDL substrate.

At step 714, back-grind to expose translation features, if needed. In this embodiment, if a FAM process was not used to expose the translation feature, then a back-grind process is used to expose the translation feature. After the semiconductor die and launcher structure are encapsulated with an encapsulant, a top surface of the encapsulated assembly is subjected to a back-grind operation to expose at least a portion of the translation feature.

At step 716, singulate packages. In this embodiment, each packaged assembly unit of a plurality of formed in the panel is singulated. The resulting individual packaged assemblies are provided for mounting and waveguide attachment in subsequent steps continuing at flow connector B.

The A2-B2 flow continues from flow connector A after step 706. At step 718, attach die and launcher structure on a package substrate. In this embodiment, a semiconductor die and a launcher structure (e.g., from step 706) are attached on a preformed package substrate.

At step 720, encapsulate die and launcher structure. In this embodiment, an encapsulant (e.g., epoxy material) at least partially encapsulates the semiconductor die and launcher structure attached to the package substrate. In one embodiment, the semiconductor die and the launcher structure are over-molded with an epoxy material encapsulant by way of a FAM process configured to expose the translation features at a top surface of the encapsulant. In one embodiment, the semiconductor die and the launcher structure are over-molded with an epoxy material encapsulant, then subjected to a back-grind process in a subsequent step to expose at least a portion of the translation feature.

At step 722, apply solder balls. In this embodiment, after the semiconductor die and the launcher structure are encapsulated, conductive ball connectors (e.g., solder balls) are affixed to a bottom surface of the package substrate. The conductive ball connectors may be any suitable conductive structure such as solder balls, gold studs, copper pillars, and the like, to connect conductive features of the package substrate with a PCB, for example.

At step 724, back-grind to expose translation features if needed. In this embodiment, if a FAM process was not used to expose the translation feature, then a back-grind process is used to expose the translation feature. After the semiconductor die and launcher structure are encapsulated with an encapsulant, a top surface of the encapsulated assembly is subjected to a back-grind operation to expose at least a portion of the translation feature.

At step 726, singulate packages. In this embodiment, each packaged assembly unit of a plurality of formed in the panel is singulated. The resulting individual packaged assemblies are provided for mounting and waveguide attachment in subsequent steps continuing at flow connector B.

At step 728, mount package on a PCB. In this embodiment, the packaged assembly (e.g., resulting from steps 716 and 726) is mounted on a PCB (e.g., PCB 204 of FIG. 2) by way of the solder balls. At step 730, align a waveguide to the package. In this embodiment, a waveguide structure (e.g., waveguide structure 200 of FIG. 2) is aligned to the packaged assembly (e.g., assembly 100 of FIG. 2) by way of the translation feature. At step 732, attach waveguide. In this embodiment, after aligning the waveguide structure to the packaged assembly, the waveguide structure is attached to the packaged assembly or the PCB. In some embodiments, the waveguide structure may be attached to both the packaged assembly and the PCB.

Figure 8:
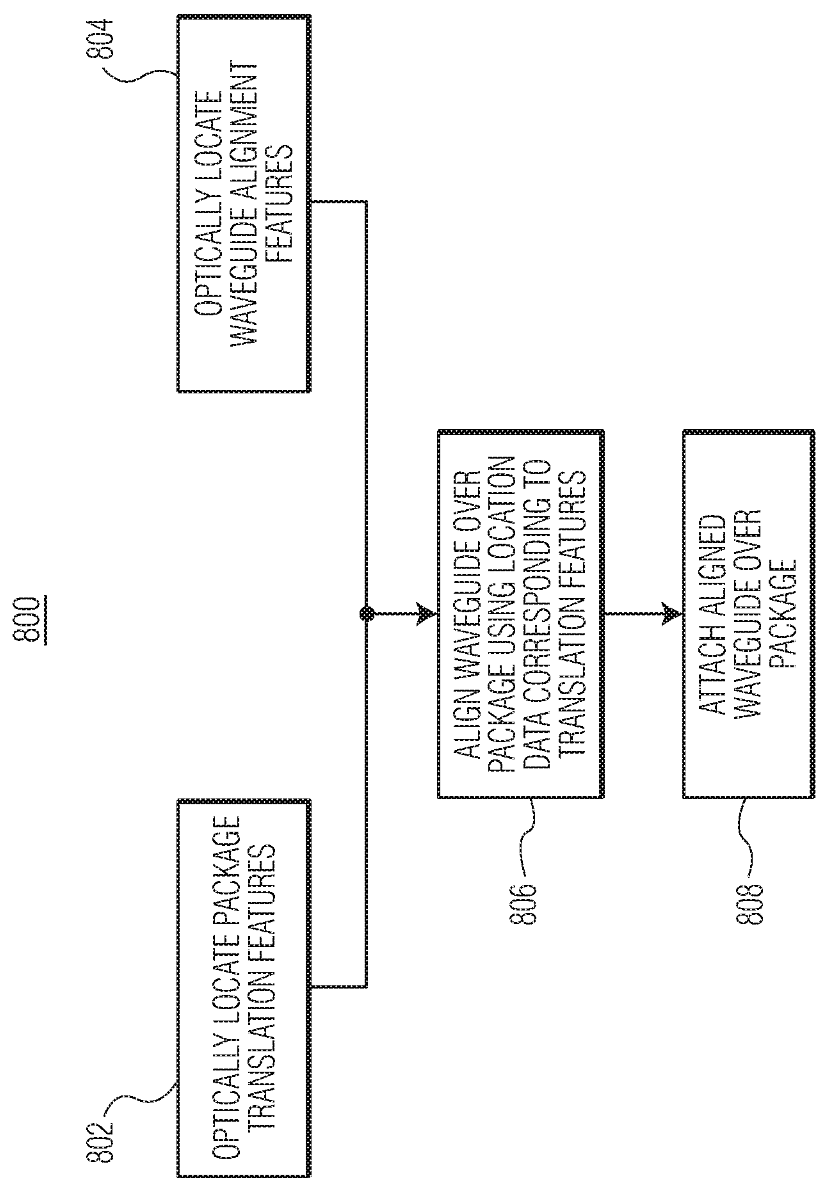
FIG. 8 illustrates, in a simplified flow diagram form, an example method of aligning a waveguide structure in accordance with an embodiment.

FIG. 8 illustrates, in a simplified flow diagram form, an example method 800 of aligning a waveguide structure in accordance with an embodiment. In this embodiment, steps of the method 800 relate to the example packaged assembly 100 and the example waveguide structure 200 depicted in FIG. 2.

At step 802, optically locate package translation features. In this embodiment, exposed translation features (e.g., translation feature 134 and 136 of FIG. 2) of a packaged assembly (e.g., assembly 100 of FIG. 2) are scanned, recognized, and located by a vision system.

At step 804, optically locate waveguide alignment features. In this embodiment, the alignment features (e.g., alignment feature 214 and 216 of FIG. 2) of the waveguide structure (e.g., waveguide structure 200 of FIG. 2) are scanned, recognized, and located by a vision system.

At step 806, align waveguide over package using location data corresponding to the translation features. In this embodiment, the location data corresponding to translation features the packaged assembly and alignment features of the waveguide structure are utilized to precisely align the waveguide structure over the packaged assembly.

At step 808, attach aligned waveguide over the package. In this embodiment, the location data corresponding to translation features the packaged assembly and alignment features of the waveguide structure are utilized to precisely align the waveguide structure over the packaged assembly. After aligning the waveguide structure to the packaged assembly, the waveguide structure is attached to the packaged assembly or the PCB, for example. In some embodiments, the waveguide structure may be attached to both the packaged assembly and the PCB.

Generally, there is provided, a semiconductor device including a package substrate; a semiconductor die attached to the package substrate; a launcher structure attached to the package substrate, the launcher structure including: a launcher substrate having a first major surface and a second major surface; a launcher portion formed from a conductive layer at the first major surface; a translation pad formed from the conductive layer at the first major surface, the translation pad separate from the launcher portion; and a translation feature formed on the translation pad, the translation feature configured for alignment of a waveguide structure. The semiconductor device may further include an encapsulant encapsulating at least a portion of the semiconductor die and the launcher structure. A portion of the translation feature may be exposed at a surface of the encapsulant. The exposed portion of the translation feature may be characterized as high-contrast relative to the encapsulant. The semiconductor device may further include a waveguide structure affixed over the encapsulant, the waveguide structure aligned by way of the translation feature. The portion of the translation feature exposed at the surface of the encapsulant may provide an indication of depth. The semiconductor device may further include a portion of a second translation feature exposed at the surface of the encapsulant, the exposed portion of the second translation feature together with the exposed portion of the first translation feature providing an indication of planarity. The portion of the translation feature exposed at the surface of the encapsulant may be exposed by way of back-grinding the surface of the encapsulant. The translation feature may be further configured for recognition by a vision system.

In another embodiment, there is provided, a method of manufacturing a semiconductor device including forming an assembly including: placing a semiconductor die and a launcher structure on a package substrate, the launcher structure including: a launcher substrate having a first major surface and a second major surface; a launcher portion formed from a conductive layer at the first major surface; a translation pad formed from the conductive layer at the first major surface, the translation pad separate from the launcher portion; and forming a translation feature on the translation pad, the translation feature configured for alignment of a waveguide structure. The forming the assembly may further include encapsulating at least a portion of the semiconductor die and the launcher structure with an encapsulant. The forming the assembly may further include exposing a portion of the translation feature at a surface of the encapsulant. The exposing the portion of the translation feature at the surface of the encapsulant may further include providing an indication of depth. The forming the assembly may further include forming a second translation feature on a second translation pad; exposing a portion of the second translation feature at the surface of the encapsulant; and providing an indication of planarity based on the exposed portions of the first translation feature and the second translation feature. The method may further include placing a waveguide structure over the assembly, the waveguide structure aligned by way of the translation feature.

In yet another embodiment, there is provided, a semiconductor device including an assembly including: a package substrate; a semiconductor die attached to the package substrate; a launcher structure attached to the package substrate, the launcher structure including: a launcher substrate having a first major surface and a second major surface; a launcher portion formed from a conductive layer at the first major surface; a translation pad formed from the conductive layer at the first major surface, the translation pad separate from the launcher portion; a translation feature formed on the translation pad; and an encapsulant encapsulating at least a portion of the semiconductor die and the launcher structure. The translation feature may be configured for recognition by a vision system. A portion of the translation feature may be exposed at a surface of the encapsulant. The portion of the translation feature exposed at the surface of the encapsulant may provide an indication of depth. The semiconductor device may further include a waveguide structure affixed over the assembly, the waveguide structure aligned by way of the translation feature.

By now, it should be appreciated that there has been provided a semiconductor device including a packaged assembly having a translation feature. A translation pad in the packaged assembly is formed from a same metal layer as a launcher. The translation feature is formed on the translation pad and is made visible at a surface of the packaged assembly. The visible portion of the translation feature provides a known relative location to the launcher and enables high accuracy alignment of a waveguide structure. The visible portion of the translation feature may be configured for indicating a thickness of an encapsulant and/or planarity of the packaged assembly.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:

a package substrate;

a semiconductor die attached to the package substrate;

a launcher structure attached to the package substrate, the launcher structure including:

a launcher substrate having a first major surface and a second major surface;

a launcher portion formed from a conductive layer at the first major surface;

a translation pad formed from the conductive layer at the first major surface, the translation pad separate from the launcher portion; and a translation feature formed on the translation pad, the translation feature configured for alignment of a waveguide structure.

2. The semiconductor device of claim 1, further comprising an encapsulant encapsulating at least a portion of the semiconductor die and the launcher structure.

3. The semiconductor device of claim 2, wherein a portion of the translation feature exposed at a surface of the encapsulant.

4. The semiconductor device of claim 3, wherein the exposed portion of the translation feature is characterized as high-contrast relative to the encapsulant.

5. The semiconductor device of claim 3, further comprising a waveguide structure affixed over the encapsulant, the waveguide structure aligned by way of the translation feature.

6. The semiconductor device of claim 3, wherein the portion of the translation feature exposed at the surface of the encapsulant provides an indication of depth.

7. The semiconductor device of claim 3, further comprising a portion of a second translation feature exposed at the surface of the encapsulant, the exposed portion of the second translation feature together with the exposed portion of the first translation feature providing an indication of planarity.

8. The semiconductor device of claim 3, wherein the portion of the translation feature exposed at the surface of the encapsulant is exposed by way of back-grinding the surface of the encapsulant.

9. The semiconductor device of claim 1, wherein the translation feature is further configured for recognition by a vision system.

10. A method of manufacturing a semiconductor device, the method comprising:

forming an assembly comprising:

placing a semiconductor die and a launcher structure on a package substrate, the launcher structure including:

a launcher substrate having a first major surface and a second major surface;

a launcher portion formed from a conductive layer at the first major surface;

a translation pad formed from the conductive layer at the first major surface, the translation pad separate from the launcher portion; and forming a translation feature on the translation pad, the translation feature configured for alignment of a waveguide structure.

11. The method of claim 10, wherein forming the assembly further comprises encapsulating at least a portion of the semiconductor die and the launcher structure with an encapsulant.

12. The method of claim 11, wherein forming the assembly further comprises exposing a portion of the translation feature at a surface of the encapsulant.

13. The method of claim 12, wherein exposing the portion of the translation feature at the surface of the encapsulant further comprises providing an indication of depth.

14. The method of claim 12, wherein forming the assembly further comprises:

forming a second translation feature on a second translation pad;

exposing a portion of the second translation feature at the surface of the encapsulant; and providing an indication of planarity based on the exposed portions of the first translation feature and the second translation feature.

15. The method of claim 10, further comprising placing a waveguide structure over the assembly, the waveguide structure aligned by way of the translation feature.

16. A semiconductor device comprising:

an assembly comprising:

a package substrate;

a semiconductor die attached to the package substrate;

a launcher structure attached to the package substrate, the launcher structure including:

a launcher substrate having a first major surface and a second major surface;

a launcher portion formed from a conductive layer at the first major surface;

a translation pad formed from the conductive layer at the first major surface, the translation pad separate from the launcher portion;

a translation feature formed on the translation pad, the translation feature configured for recognition by a vision system; and an encapsulant encapsulating at least a portion of the semiconductor die and the launcher structure.

17. The semiconductor device of claim 16, wherein a portion of the translation feature is exposed at a surface of the encapsulant.

18. The semiconductor device of claim 17, wherein the portion of the translation feature exposed at the surface of the encapsulant provides an indication of depth.

19. The semiconductor device of claim 16, further comprising a waveguide structure affixed over the assembly, the waveguide structure aligned by way of the translation feature.

20. A semiconductor device comprising:

an assembly comprising:

a package substrate;

a semiconductor die attached to the package substrate;

a launcher structure attached to the package substrate, the launcher structure including:

a launcher substrate having a first major surface and a second major surface;

a launcher portion formed from a conductive layer at the first major surface;

a translation pad formed from the conductive layer at the first major surface, the translation pad separate from the launcher portion;

a translation feature formed on the translation pad; and an encapsulant encapsulating at least a portion of the semiconductor die and the launcher structure, a portion of the translation feature exposed at a surface of the encapsulant, the exposed portion of the translation feature to provide an indication of depth.

* * * * *